(12) United States Patent
Weng

(10) Patent No.: US 11,575,498 B2
(45) Date of Patent: Feb. 7, 2023

(54) CLOCK AND DATA RECOVERY CIRCUITS

(71) Applicant: HIMAX TECHNOLOGIES LIMITED, Tainan (TW)

(72) Inventor: Meng-Chih Weng, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 17/353,845

(22) Filed: Jun. 22, 2021

(65) Prior Publication Data
US 2022/0407677 A1 Dec. 22, 2022

(51) Int. Cl.
*H04L 7/033* (2006.01)
*H03L 7/08* (2006.01)
*H02M 3/07* (2006.01)

(52) U.S. Cl.
CPC ............. *H04L 7/033* (2013.01); *H02M 3/07* (2013.01); *H03L 7/0807* (2013.01)

(58) Field of Classification Search
CPC ......... H04L 7/033; H02M 3/07; H03L 7/0807
See application file for complete search history.

(56) References Cited

U.S. PATENT DOCUMENTS

| 7,580,497 | B2 | 8/2009 | Wang | |
|---|---|---|---|---|
| 10,868,663 | B1 | 12/2020 | Turker Melek | |
| 11,115,033 | B1 * | 9/2021 | Wu | H03L 7/089 |
| 2005/0058235 | A1 | 3/2005 | Beeson | |
| 2005/0105660 | A1 * | 5/2005 | Knotts | H03D 13/004 |
| | | | | 375/376 |
| 2007/0041485 | A1 * | 2/2007 | Chang | H03L 7/113 |
| | | | | 375/376 |
| 2010/0329318 | A1 * | 12/2010 | Dai | H04L 1/20 |
| | | | | 375/224 |
| 2014/0064423 | A1 | 3/2014 | Chen | |
| 2015/0078427 | A1 | 3/2015 | Lin | |
| 2017/0077933 | A1 | 3/2017 | Zhang | |
| 2020/0228303 | A1 | 7/2020 | Manian | |

FOREIGN PATENT DOCUMENTS

| CN | 102064825 A | 5/2011 |
|---|---|---|
| TW | I408926 | 9/2013 |
| TW | I636669 B | 9/2018 |

* cited by examiner

*Primary Examiner* — Janice N Tieu
(74) *Attorney, Agent, or Firm* — Winston Hsu

(57) ABSTRACT

A clock and data recovery circuit includes a voltage controlled oscillator, a frequency detector and a control circuit. The voltage controlled oscillator is configured to generate a clock signal according to a voltage signal. The frequency detector is configured to detect whether increasing a frequency of the clock signal is required according to a plurality of sampling results of the input data signal and accordingly generate a first up control signal. The control circuit is coupled to the voltage controlled oscillator and the frequency detector and configured to adjust the voltage signal according to the first up control signal. The clock and data recovery circuit operates in a data recovery mode after detecting that the frequency of the clock signal is locked, and the frequency detector is configured to detect whether increasing the frequency of the clock signal is required in the data recovery mode.

15 Claims, 4 Drawing Sheets

CLOCK AND DATA RECOVERY CIRCUITS

BACKGROUND OF THE INVENTION

1. Field of the Invention

The invention is related to a Clock and Data Recovery (CDR) circuit, and more particularly, to a CDR circuit with frequency control capability in the data recovery mode.

2. Description of the Prior Art

To communicate data from one device to another, the receiving device must know when to sample the data signal that it receives from the transmitting device. Typically, a phase lock loop (PLL) is used to generate the necessary frequency waveform. The receiving device requires a clock alignment and regeneration circuit such as the PLL and/or delay locked loop (DLL) to regenerate the correct clock frequency from a reference clock signal and synchronize the clock to the input data. The clock data recovery (CDR) circuit with a PLL circuit is the one usually used to output data and synchronized clock by using a reference clock signal.

However, accuracy of the frequency of the reference clock signal provided to the PLL and/or the CDR circuit is a key factor which affecting the correctness of data recovery. If the frequency of the reference clock drifts, undesired sampling error occurs and the data cannot be correctly recovered. The problem of frequency drift in the reference clock is more serious when the reference clock signal is provided by an oscillator circuit instead of a crystal oscillator.

Therefore, a novel Clock and Data Recovery (CDR) circuit with frequency control capability (including frequency drift detection and adjustment) in the data recovery mode to compensate for frequency drift in the reference clock is highly required.

SUMMARY OF THE INVENTION

It is an objective of the invention to provide a novel CDR circuit with frequency control capability in the data recovery mode to compensate for frequency drift in the reference clock.

According to an embodiment of the invention, a clock and data recovery circuit for recovering clock and data information from an input data signal includes a voltage controlled oscillator, a frequency detector and a control circuit. The voltage controlled oscillator is configured to generate a clock signal according to a voltage signal. The frequency detector is configured to detect whether increasing a frequency of the clock signal is required according to a plurality of sampling results of the input data signal and accordingly generate a first up control signal. The control circuit is coupled to the voltage controlled oscillator and the frequency detector and configured to adjust the voltage signal according to the first up control signal. The clock and data recovery circuit operates in a data recovery mode after detecting that the frequency of the clock signal is locked, and the frequency detector is configured to detect whether increasing the frequency of the clock signal is required in the data recovery mode.

According to another embodiment of the invention, a clock and data recovery circuit for recovering clock and data information from an input data signal includes a voltage controlled oscillator, a frequency detector, a phase detector, a charge pump circuit and a control circuit. The voltage controlled oscillator is configured to generate a clock signal according to a voltage signal. The frequency detector is configured to detect whether increasing a frequency of the clock signal is required according to a plurality of sampling results of the input data signal and accordingly generate a first up control signal. The phase detector is configured to receive the input data signal and the clock signal, detect phase lead or phase lag of the clock signal according to the sampling results of the input data signal and accordingly generate a second up control signal and a first down control signal. The charge pump circuit is coupled to the voltage controlled oscillator and the phase detector and configured to adjust the voltage signal according to the second up control signal and the first down control signal. The control circuit is coupled to the voltage controlled oscillator and the frequency detector and configured to adjust the voltage signal according to the first up control signal. The clock and data recovery circuit operates in a data recovery mode after detecting that the frequency of the clock signal is locked, the frequency detector and the phase detector operates in the data recovery mode.

According to yet another embodiment of the invention, a clock and data recovery circuit for recovering clock and data information from an input data signal comprises a clock recovery module and a data recovery module. The clock recovery module is configured to operate in a clock recovery mode to lock a frequency of a clock signal. The data recovery module is configured to operate in a data recovery mode to recover data information according to the input data signal. The clock and data recovery circuit switches from the clock recovery mode to the data recovery mode after detecting that the frequency of the clock signal is locked. The data recovery module comprises a voltage controlled oscillator, a charge pump circuit, a frequency detector and a control circuit. The voltage controlled oscillator is configured to generate the clock signal according to a voltage signal. The charge pump circuit is coupled to the voltage controlled oscillator and configured to adjust the voltage signal according to a up control signal and a down control signal. The frequency detector is configured to detect whether increasing the frequency of the clock signal is required according to a plurality of sampling results of the input data signal and accordingly generate a supplementary up control signal. The control circuit is coupled to the voltage controlled oscillator and the frequency detector and configured to further adjust the voltage signal according to the supplementary up control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
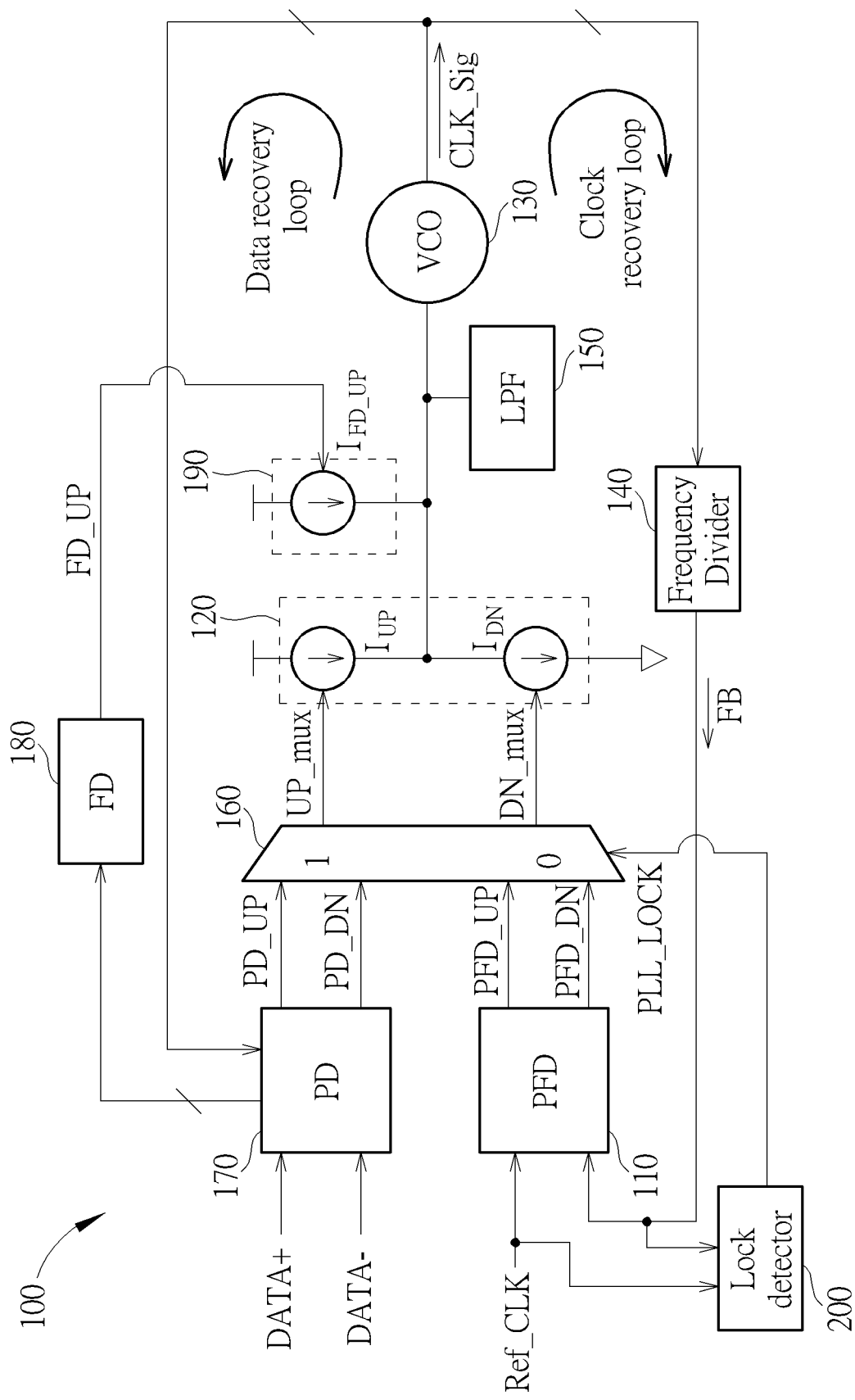
FIG. 1 is an exemplary block diagram of a Clock and Data Recovery circuit according to an embodiment of the invention.

FIG. 1 is an exemplary block diagram of a Clock and Data Recovery (CDR) circuit according to an embodiment of the invention. The CDR circuit 100 may be switched between a clock recovery mode and a data recovery mode and configured to recover clock and data information from an input data signal. The CDR circuit 100 may initially operate in the clock recovery mode to lock a frequency of a clock signal CLK_Sig based on a reference signal Ref_CLK, and switch to operate in the data recovery mode to recover data information after a lock indication signal PLL_LOCK indicates that the frequency of the clock signal CLK_Sig is locked.

The CDR circuit 100 may comprise a clock recovery module and a data recovery module. The clock recovery module comprises a plurality of circuits operating in the clock recovery mode to lock the frequency of the clock signal CLK_Sig and the data recovery module also comprises a plurality of circuits operating in the data recovery mode to recover data information according to the input data signal. Noted that the clock recovery module and the data recovery module may share one or more circuits comprised in the CDR circuit 100. For example, the charge pump circuit 120, the voltage controlled oscillator (VCO) 130, the low pass filter (LPF) 150, and/or the multiplexer 160 of the CDR circuit 100 may be shared by the clock recovery module and the data recovery module. Therefore, the charge pump circuit 120, the VCO 130, the LPF 150 and the multiplexer 160 may be a part of the clock recovery module as well as a part of the data recovery module.

In the embodiments of the invention, the clock recovery module may comprise a phase frequency detector (PFD) 110, the charge pump circuit 120, the VCO 130, a frequency divider 140, the LPF 150 and the multiplexer 160, and the data recovery module may comprise a phase detector (PD) 170, a frequency detector (FD) 180, a control circuit 190, the multiplexer 160, the charge pump circuit 120, the LPF 150 and the VCO 130.

In the beginning of a clock and data recovery procedure, a clock recovery loop may be conducted by the clock recovery module, so as to lock the frequency of the clock signal CLK_Sig generated by the VCO based on the reference signal Ref_CLK. The PFD 110 is configured to receive the reference signal Ref_CLK and a feedback signal FB generated by the frequency divider 140, detect phase difference (or, frequency difference) between the reference signal Ref_CLK and the feedback signal FB and accordingly generate a up control signal PFD_UP and a down control signal PFD_DN. The up control signal PFD_UP and the down control signal PFD_DN may be pulse signals with adjustable pulse width. When detecting that the phase of the reference signal Ref_CLK leads the phase of the feedback signal FB (or, detecting that the frequency of the reference signal Ref_CLK is higher than that of the feedback signal FB), the PFD 110 may generate an "UP" pulse in the up control signal PFD_UP. When detecting that the phase of the reference signal Ref_CLK lags the phase of the feedback signal FB (or, detecting that the frequency of the reference signal Ref_CLK is lower than that of the feedback signal FB), the PFD 110 may generate a "DOWN" pulse in the down control signal PFD_DN.

The multiplexer 160 is coupled to the PFD 110, the PD 170 and the charge pump circuit 120 and configured to select the up control signal and the down control signal generated by the PFD 110 or the PD 170 as the multiplexed signals UP_mux and DN_mux in response to the lock indication signal PLL_LOCK, and output the multiplexed signals UP_mux and DN_mux to the charge pump circuit 120. The lock indication signal PLL_LOCK is generated by a lock detector 200. The lock detector 200 is configured to detect whether the frequency of the clock signal CLK_Sig is locked according to the reference signal Ref_CLK and the feedback signal FB and accordingly generate the lock indication signal PLL_LOCK. For example, the value of the lock indication signal PLL_LOCK may be initially set to 0 to indicate that the frequency of the clock signal CLK_Sig has not been locked. When PLL_LOCK=0, the CDR circuit 100 operates in the clock recovery mode and the clock recovery loop is conducted by the clock recovery module as discussed above. In response to the unlocked condition PLL_LOCK=0, the multiplexer 160 outputs the up control signal PFD_UP and the down control signal PFD_DN generated by the PFD 110 as the multiplexed signals UP_mux and DN_mux.

The charge pump circuit 120 is coupled to the VCO 130 and configured to adjust the voltage signal of the VCO 130 according to the multiplexed signals UP_mux and DN_mux. For example, the charge pump circuit 120 may respectively comprise one or more current sources in a charging path and a discharging path. When the multiplexed signal UP_mux carries an "UP" pulse (for example, when the value of the multiplexed signal UP_mux is set to "1"), a charging current $I_{UP}$ is conducted in the charging path so as to adjust the voltage signal (for example, increase its voltage) provided at the input terminal of the VCO 130. On the other hand, when the multiplexed signal DN_mux carries an "DOWN" pulse (for example, when the value of the multiplexed signal DN_mux is set to "1"), a discharging current $I_{DN}$ is conducted in the discharging path so as to adjust the voltage signal (for example, decrease its voltage) provided at the input terminal of the VCO 130.

The VCO 130 is configured to generate the clock signal CLK_Sig with a plurality of clock phases (for example, 0 degree, 90 degrees, 180 degrees and 270 degrees) according to the voltage signal provided at its input terminal. The clock signal CLK_Sig (with any phase) is provided to the frequency divider 140. The frequency divider 140 is coupled between the VCO 130 and the PFD 110 and is configured to generate the feedback signal FB according to the clock signal CLK_Sig and a frequency scale factor. The clock recovery module may be implemented as a phase lock loop (PLL) circuit and the LPF 150 is configured to provide filtering function, so as to increase the stability of the PLL circuit.

According to an embodiment of the invention, the reference signal Ref_CLK may be generated by an oscillator circuit (not shown in FIG. 1). In order to compensate for the undesired frequency drift in the reference clock Ref_CLK generated by the oscillator circuit, the CDR circuit 100 is designed to have frequency control capability (including frequency drift detection and adjustment) in the data recovery mode. By introducing an extra charging path at the input terminal of the VCO 130, the frequency of the clock signal CLK_Sig generated by the VCO 130 may be further adjusted in the data recovery mode. In this manner, the frequency drift in the reference clock Ref_CLK can be compensated for by adjusting the frequency of the clock signal CLK_Sig and the problem of incorrect data recovery due to the frequency drift in the reference clock Ref_CLK can be solved.

As discussed above, the lock detector 200 is configured to detect whether the frequency of the clock signal CLK_Sig is locked and accordingly generate the lock indication signal PLL_LOCK. When the lock detector 200 detects that the frequency of the clock signal CLK_Sig is locked to the frequency of the reference clock Ref_CLK, the lock detector 200 sets the value of the lock indication signal PLL_LOCK to 1. When PLL_LOCK=1, the CDR circuit 100 operates in the data recovery mode and the data recovery loop is conducted by the data recovery module. In response to the locked condition PLL_LOCK=1, the multiplexer 160 outputs the up control signal PD_UP and the down control signal PD_DN generated by the PD 170 as the multiplexed signals UP_mux and DN_mux.

Noted that when frequency of the clock signal CLK_Sig is locked, the frequency (labeled as CLK_F) of the clock signal CLK_Sig is substantially equal to a multiplication result of the frequency (labeled as Ref_F) of the reference clock Ref_CLK multiplied by the frequency scale factor (labeled as SF) of the frequency divider 140, that is, CLK_F=Ref_F*SF. In the embodiments of the invention, suppose that the purpose of the CDR circuit 100 is to finally lock the frequency of the clock signal CLK_Sig to a target clock frequency (labeled as Target_F) so as to correctly recover the data information from the input data signal, where the target clock frequency is related to the data rate of the input data signal and may also be the VCO needed frequency to receive input data, the frequency scale factor SF of the frequency divider 140 may be well designed, so that the frequency CLK_F of the clock signal CLK_Sig is close to but lower than the target clock frequency Target_F when the CDR circuit 100 leaves the clock recovery mode. For example, the frequency CLK_F of the clock signal CLK_Sig may be lower than the target clock frequency Target_F when the lock detector 200 detects that frequency CLK_F of the clock signal CLK_Sig is locked.

As an example, suppose that the data rate of the input data signal is 10 GHz and the VCO 130 of the CDR circuit 100 is designed as a half-rate VCO, the target clock frequency Target_F may be 5 GHz. In an embodiment of the invention, if the relationship between the target clock frequency Target_F and the frequency Ref_F of the reference clock Ref_CLK is expressed as: Target_F=Ref_F*SF_A, where the SF_A may represent the actually required frequency scale factor, the frequency scale factor SF of the frequency divider 140 may be set to a value lower than actually required frequency scale factor SF_A. In an embodiment of the invention, SF=0.9*SF_A. Thus, in this embodiment, the locked condition of the clock recovery module (or, the PLL circuit) may be that CLK_F=Ref_F*SF=0.9*Target_F.

Therefore, in the embodiments of the invention, the CDR circuit 100 is configured to lock the frequency of the clock signal CLK_Sig to a frequency that is close to but lower than the target clock frequency in the clock recovery mode, and then further lock the frequency of the clock signal CLK_Sig to the target clock frequency (that is, recover the clock information) in the beginning of the data recovery mode and also recovery the data information in the data recovery mode.

As discussed above, the CDR circuit 100 switches from the clock recovery mode to the data recovery mode after detecting that the frequency of the clock signal CLK_Sig is locked. In the data recovery mode, the PD 170 is configured to receive the input data signal, such as the differential input data signals DATA+ and DATA− shown in FIG. 1, receive the clock signal CLK_Sig from the VCO 130, detect phase lead or phase lag of the clock signal CLK_Sig according to the sampling results of the input data signal and accordingly generate the up control signal PD_UP and the down control signal PD_DN.

Figure 2:
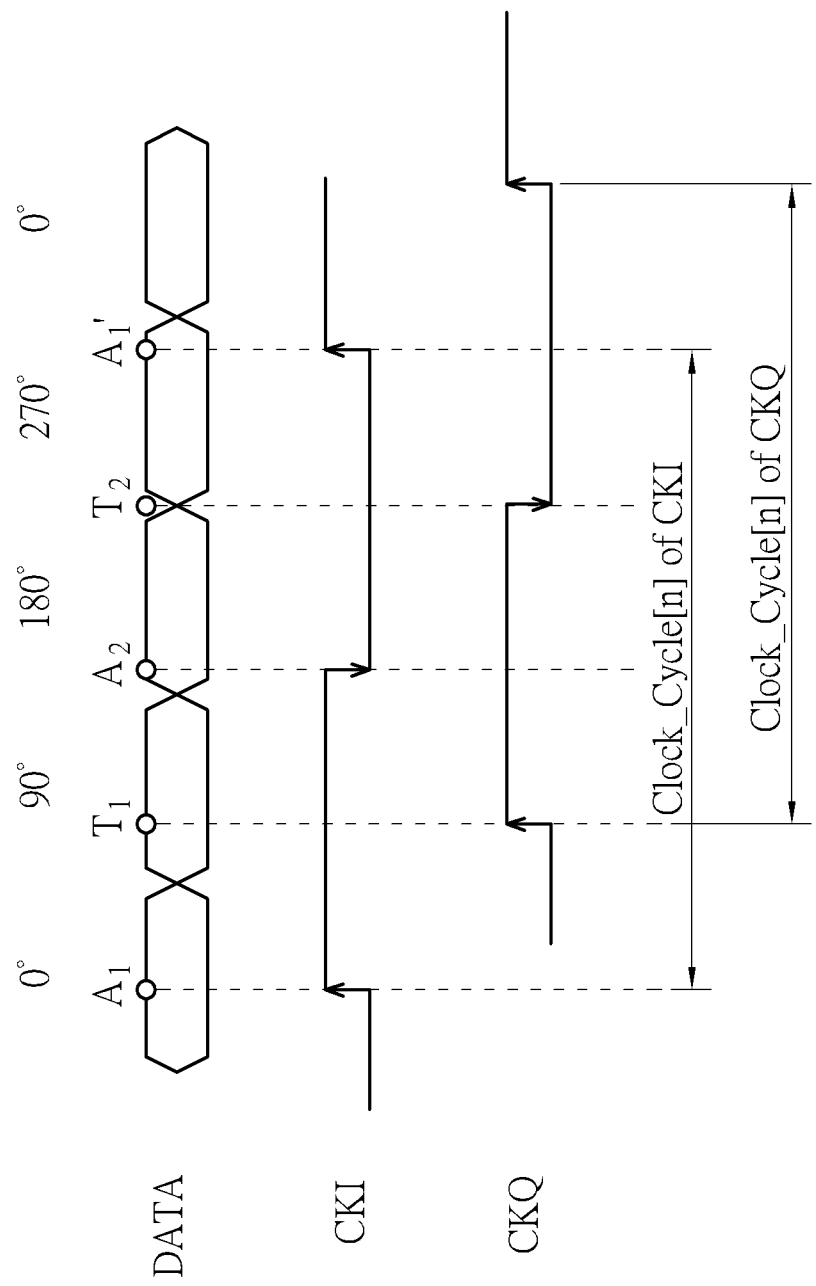
FIG. 2 is a schematic diagram showing the sampling of the input data signal according to the clock signal with different clock phases according to an embodiment of the invention.

To be more specific, in an embodiment of the invention, the PD 170 may receive the clock signal CLK_Sig with different clock phases from the VCO 130 for sampling the input data signal. FIG. 2 is a schematic diagram showing the sampling of the input data signal according to the clock signal CLK_Sig with different clock phases according to an embodiment of the invention, where the data signal DATA represents the input data signal, which may be either the input data signal DATA+ or the input data signal DATA−, the clock signal CKI represents the in-phase clock signal (for example, the clock signal CLK_Sig with 0 degree clock phase) and the clock signal CKQ represents the quadrature-phase clock signal (for example, the clock signal CLK_Sig with 90 degree clock phase). Generally, the in-phase clock signal CKI is utilized to sample the data portion of the data signal DATA, and the quadrature-phase clock signal CKQ is utilized to sample the edge of the corresponding data. The PD 170 may detect whether the phase of the clock signal CLK_Sig lead or lag the phase of the target clock signal (for example, the clock signal having the target clock frequency) that can be used to correctly recover the data information according to the data and edge sampling results.

The notations $A_x$ in FIG. 2 represent the x-th data sampling result in the current clock cycle (for example, the Clock_Cycle[n] as shown), the notations $T_x$ in FIG. 2 represent the x-th edge sampling result in the current clock cycle, the notations $A_x'$ represent the x-th data sampling result in the next clock cycle, and the rest may be deduced by analogy, where since the phase difference between the clock signals CKI and CKQ is 90 degrees, the clock signal CKQ is a 90 degrees delayed version of the clock signal CKI for the same clock cycle. The PD 170 may detect phase lead or phase lag of the clock signal CLK_Sig by detecting the occurrence of transitions (i.e., from logical "0" to logical "1" or from logical "1" to logical "0") between two consecutive samples. For example, the PD 170 may perform some logical operations on at least two sampling results, such as the sampling results $A_x$ and $T_x$, $A_{(x+1)}$ and $T_{(x+1)}$, $A_{(x+1)}$ and $T_x$, and/or any combination thereof, so as to detect the occurrence of transitions between two consecutive samples.

In an embodiment of the invention, the PD 170 may perform the logical operation, such as an exclusive OR (XOR) operation, on the x-th data and edge sampling results (for example, the x-th data sampling result and its following edge sampling result) obtained in the same clock cycle to obtain a calculation result, collect one or more aforementioned calculation results (for example, the calculation results corresponding to the x-th and (x+1)-th sampling results), and generate the up control signal PD_UP based on the collected calculation results (for example, the PD 170 may perform an OR operation on the collected calculation results corresponding to the current clock cycle to generate up control signal PD_UP). In addition, the PD 170 may perform the logical operation on the data and edge sampling results obtained in the same clock cycle or different (e.g. adjacent) clock cycles (for example, the x-th edge sampling result and its following data sampling result, where the edge sampling result and its following data sampling result may be in the same or different clock cycles) to obtain a calculation result, collect one or more aforementioned calculation results, and generate the down control signal PD_DN based on the collected calculation results.

Taking the data sampling results $A_1$, $A_2$, $A_1'$ and the edge sampling results $T_1$ and $T_2$ as an example, the PD 170 may perform XOR operation on the sampling results $A_1$ and $T_1$ to obtain a first calculation result and perform XOR operation on the sampling results $A_2$ and $T_2$ to obtain a second calculation result, and perform an OR operation on the first and second calculation results to generate the up control signal PD_UP. In addition, the PD 170 may perform XOR operation on the sampling results $T_1$ and $A_2$ to obtain a third calculation result and perform XOR operation on the sampling results $T_2$ and $A_1'$ to obtain a fourth calculation result, and perform an OR operation on the third and fourth calculation results to generate the down control signal PD_DN. The up control signal PD_UP and the down control signal PD_DN may be pulse signals with adjustable pulse width. When detecting that the phase of the clock signal CLK_Sig lags the phase of the target clock signal, an "UP" pulse may be generated in the up control signal PD_UP (for example, via the aforementioned logical operations). When detecting that the phase of the clock signal CLK_Sig leads the phase of the target clock signal, a "DOWN" pulse may be generated in the down control signal PD_DN (for example, via the aforementioned logical operations).

In the embodiments of the invention, the data and edge sampling results (such as the data sampling results $A_1$, $A_2$, $A_1'$ and the edge sampling results $T_1$ and $T_2$ shown in FIG. 2) are further provided to the frequency detector (FD) 180. The FD 180 is configured to detect whether increasing the frequency of the clock signal CLK_Sig is required according to the sampling results of the input data signal obtained from the PD 170 and accordingly generate a supplementary up control signal FD_UP. For example, when the FD 180 detects that the phase of the clock signal CLK_Sig lags the phase of the target clock signal according to the sampling results of the input data signal, the FD 180 generates the supplementary up control signal FD_UP having an "UP" pulse, thereby controlling the control circuit 190 to provide an extra charging current $I_{FD\_UP}$ at the input terminal of the VCO 130, so as to increase the frequency CLK_F of the clock signal CLK_Sig. Noted that in some embodiments of the invention, a deserializer may be added before the FD 180 for deserializing the data and edge sampling results.

Suppose that the FD 180 obtains a plurality of data sampling results D[0]~D[N] and a plurality of edge sampling results E[0]~E[N] in one clock cycle, the FD 180 may perform some logical operations on at least two successive data sampling results, for example, D[y] and D[y+1], and the associated edge sampling result for example, E[y], to obtain a calculation result associated with the y-th sampling results, collect one or more calculation results associated with the same clock cycle and generate the supplementary up control signal FD_UP based on the collected calculation results.

For example, the FD 180 may perform XOR operation on the sampling results D[y] and E[y] to obtain a first calculation result and perform XOR operation on the sampling results E[y] and D[y+1] to obtain a second calculation result, perform an AND operation on the first and second calculation results to obtain a calculation result FD_UP[y] associated with the y-th sampling results. For another example, the FD 180 may perform XOR operation on the sampling results D[y+1] and E[y+1] to obtain a third calculation result and perform XOR operation on the sampling results E[y+1] and D[y+2] to obtain a fourth calculation result, perform an AND operation on the third and fourth calculation results to obtain a calculation result FD_UP[y+1] associated with the (y+1)-th sampling results. The FD 180 may further collect one or more calculation results associated with the same clock cycle, for example, FD_UP[0]~ FD_UP[N] and perform OR operation on the calculation results associated with the same clock cycle to generate the supplementary up control signal FD_UP. For example, in an embodiment of the invention, FD_UP=FD_UP[0]+FD_UP[1]+ . . . +FD_UP[N], where the operator '+' here represents the logical OR operation. In the embodiments of the invention, the supplementary up control signal FD_UP may be a pulse signal with adjustable pulse width. When detecting that increasing the frequency of the clock signal CLK_Sig is required, an "UP" pulse may be generated in the supplementary up control signal FD_UP through the aforementioned OR operations.

Referring back to FIG. 1, in the embodiments of the invention, the control circuit 190 is coupled to the VCO 130 and the FD 180 and may comprise at least a current source $I_{FS\_UP}$. The control circuit 190 is configured to provide an extra charging path to further adjust the voltage signal provided at the input terminal of the VCO 130 according to the supplementary up control signal FD_UP. For example, when the supplementary up control signal FD_UP carries an "UP" pulse (for example, when the value of the supplementary up control signal FD_UP is set to "1"), the charging current $I_{FD\_UP}$ may be conducted so as to provide an extra charging path to adjust the voltage signal (for example, increase its voltage) provided at the input terminal of the VCO 130 in response to the supplementary up control signal FD_UP. In an embodiment of the invention, with the aid of the charging current $I_{FD\_UP}$ conducted on the extra charging path provided by the control circuit 190 in response to the supplementary up control signal FD_UP provided by the FD 180, the frequency CLK_F of the clock signal CLK_Sig may be further adjusted and increased from 0.9*Target_F to approach the target clock frequency Target_F. For example, the frequency CLK_F of the clock signal CLK_Sig may be gradually increased from 0.9*Target_F in response to the supplementary up control signal FD_UP provided by the FD 180 in the data recovery mode.

It should be noted that in the embodiments of the invention, the FD 180 may be enabled in beginning of the data recovery mode and may be disabled after a predetermined period. Therefore, in the embodiments of the invention, in the beginning of the data recovery mode, the voltage signal provided at the input terminal of the VCO 130 may be controlled (or, adjusted) in response to both the control signals output by the PD 170 (for example, the up control signal PD_UP or the down control signal PD_DN) and FD 180 (for example, the supplementary up control signal FD_UP). After a predetermined period, the FD 180 may be disabled and the voltage signal provided at the input terminal of the VCO 130 may be controlled (or, adjusted) in response to only the control signal output by the PD 170. In the embodiments of the invention, the predetermined period may be set to a value that is long enough for the clock signal CLK_Sig to be locked to the target clock frequency, and the lock condition may be, for example, CLK_F=Target_F. Continuing the previous example where SF=0.9*SF_A and the locked condition of the clock recovery module is set to CLK_F=Ref_F*SF=0.9*Target_F, when entering the data recovery mode and from the beginning of the data recovery mode, the frequency CLK_F of the clock signal CLK_Sig may be further adjusted and increased from 0.9*Target_F to the target clock frequency Target_F in the predetermined period.

Figure 4:
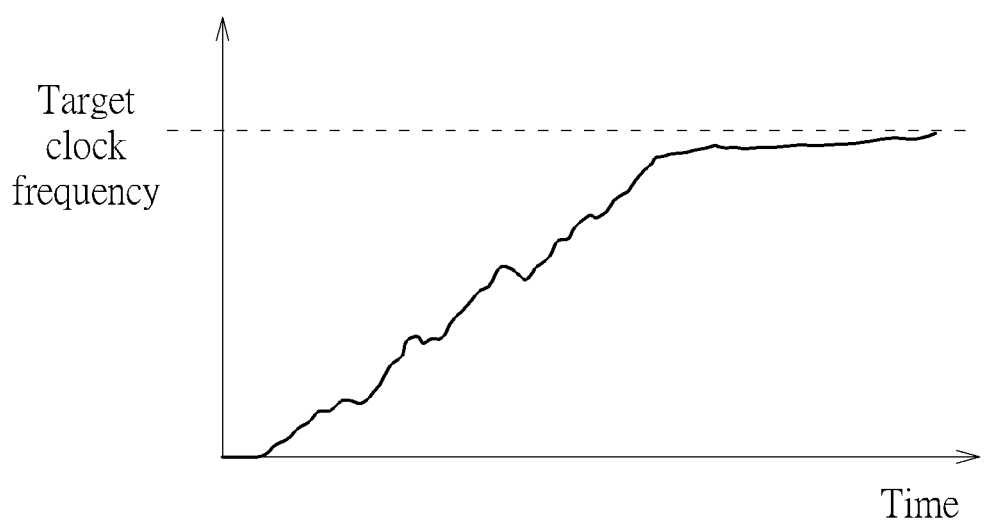
FIG. 4 is a schematic diagram showing the procedure of change in the frequency CLK_F of the clock signal CLK_Sig in the data recovery mode according to an embodiment of the invention.

FIG. 4 is a schematic diagram showing the procedure of change in the frequency CLK_F of the clock signal CLK_Sig according to an embodiment of the invention. As shown in FIG. 4, the frequency CLK_F of the clock signal CLK_Sig is increased from 0.9*Target_F to approach the target clock frequency Target_F (e.g. the VCO needed frequency to receive input data) in the data recovery mode. In an embodiment of the invention, in the data recovery mode, the frequency CLK_F of the clock signal CLK_Sig is increased to approach, but does not exceed, the target clock frequency Target_F.

In this manner, the frequency drift in the reference clock Ref_CLK can be compensated for by further adjusting the frequency of the clock signal CLK_Sig in the data recovery mode and the problem of incorrect data recovery due to the frequency drift in the reference clock Ref_CLK can be solved.

Referring to the exemplary waveform shown in FIG. 2, in this example, the frequency CLK_F of the clock signal CLK_Sig is slower than the target clock frequency Target_F. Therefore, in the beginning of the data recovery mode, the frequency CLK_F of the clock signal CLK_Sig will be further increased under the control of the FD 180.

Figure 3:
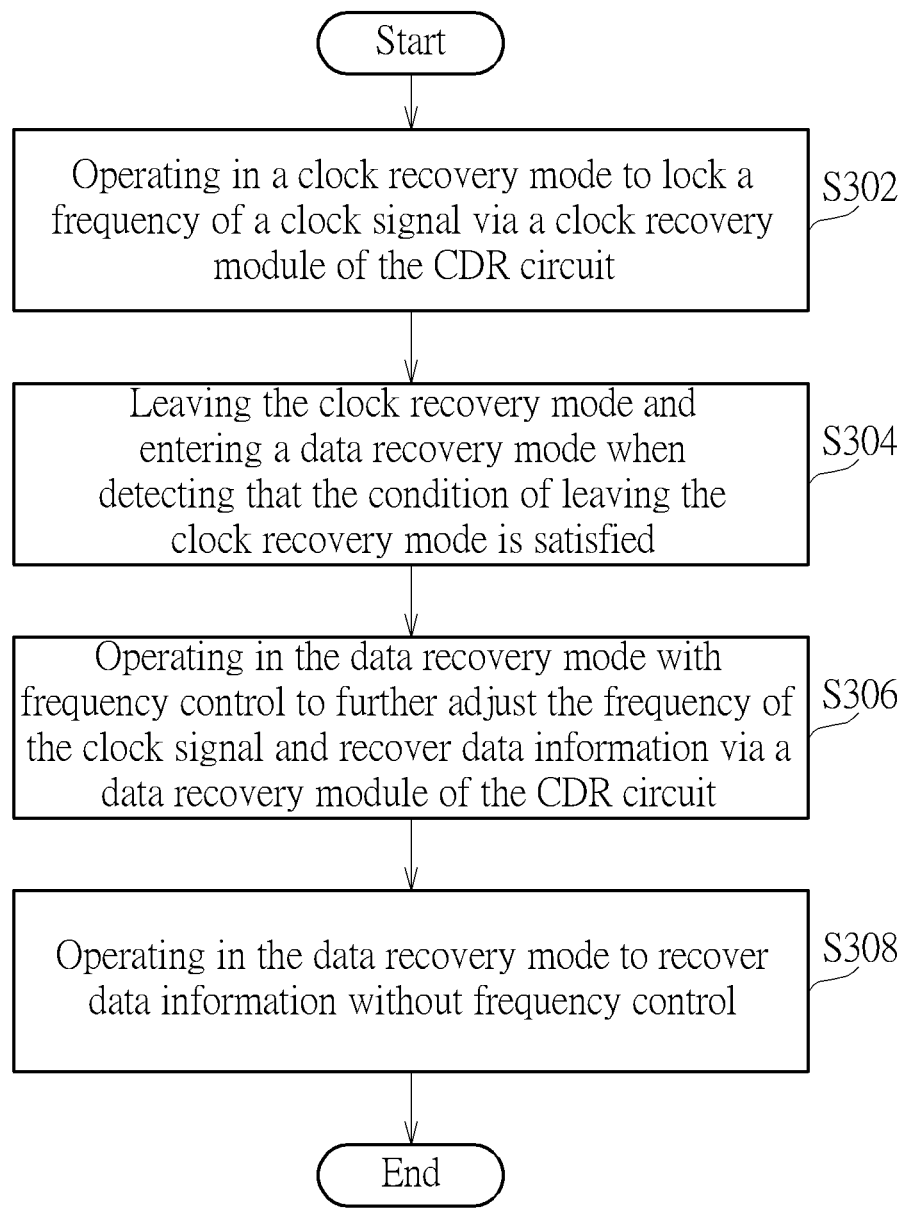
FIG. 3 is a flow chart of a method for recovering clock and data information from an input data signal by using a clock and data recovery circuit with frequency control capability in the data recovery mode according to an embodiment of the invention.

FIG. 3 is a flow chart of a method for recovering clock and data information from an input data signal by using a CDR with frequency control capability in the data recovery mode according to an embodiment of the invention. The method may comprise the following steps:

Step S302: Operating in a clock recovery mode to lock a frequency of a clock signal via a clock recovery module of the CDR circuit. In an embodiment of the invention, the condition of leaving the clock recovery mode may be set to that when the frequency of the clock signal is locked to a value that is close to but lower than a target clock frequency Target_F which can be used to precisely sample the input data signal and correctly recover the data information.

Step S304: Leaving the clock recovery mode and entering a data recovery mode when detecting that the condition of leaving the clock recovery mode is satisfied.

Step S306: Operating in the data recovery mode with frequency control to further adjust (e.g. increase) the frequency of the clock signal and (optionally) recover data information via a data recovery module of the CDR circuit. In an embodiment of the invention, the condition of stop adjusting the frequency of the clock signal in the data recovery mode may be set to that when increasing the frequency of the clock signal is determined not required anymore, or may be set to that when a predetermined period expires.

Step S308: Operating in the data recovery mode to recover data information without frequency control when detecting that the condition of stop adjusting the frequency of the clock signal is satisfied.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock and data recovery circuit, for recovering clock and data information from an input data signal, comprising:
    a voltage controlled oscillator, configured to generate a clock signal according to a voltage signal;
    a frequency detector, configured to detect whether increasing a frequency of the clock signal is required according to a plurality of sampling results of the input data signal and accordingly generate a first up control signal; and
    a control circuit, coupled to the voltage controlled oscillator and the frequency detector and configured to adjust the voltage signal according to the first up control signal;
    wherein in response to the frequency of the clock signal being equal to a multiplication result of a frequency of a reference signal and a frequency scale factor of a frequency divider, the frequency of the clock signal is locked, and is lower than a target clock frequency;
    wherein the clock and data recovery circuit operates in a data recovery mode after detecting that the frequency of the clock signal is locked, and the frequency detector is configured to detect whether unidirectionally increasing the frequency of the clock signal to be further locked to the target clock frequency is required in the data recovery mode.

2. The clock and data recovery circuit of claim 1, further comprising:
    a phase detector, configured to receive the input data signal and the clock signal, detect phase lead or phase lag of the clock signal according to the sampling results of the input data signal and accordingly generate a second up control signal and a first down control signal; and
    a charge pump circuit, coupled to the voltage controlled oscillator and the phase detector and configured to adjust the voltage signal according to the second up control signal and the first down control signal.

3. The clock and data recovery circuit of claim 2, wherein the phase detector is configured to detect the phase lead or the phase lag of the clock signal in the data recovery mode.

4. The clock and data recovery circuit of claim 2, wherein the frequency detector is enabled in beginning of the data recovery mode and is disabled after a predetermined period.

5. The clock and data recovery circuit of claim 3, further comprising:
    a phase frequency detector, configured to receive the reference signal and a feedback signal, detect phase difference between the reference signal and the feedback signal and accordingly generate a third up control signal and a second down control signal,
    wherein the phase frequency detector is configured to detect the phase difference in a clock recovery mode for the clock and data recovery circuit to lock the frequency of the clock signal, and
    the charge pump circuit is further coupled to the phase frequency detector and is configured to adjust the voltage signal according to the third up control signal and the second down control signal in the clock recovery mode.

6. The clock and data recovery circuit of claim 5, further comprising:
    a multiplexer, coupled to the phase detector, the phase frequency detector and the charge pump circuit and configured to output the third up control signal and the second down control signal to the charge pump circuit in the clock recovery mode and output the second up control signal and the first down control signal to the charge pump circuit in the data recovery mode.

7. The clock and data recovery circuit of claim 5, further comprising:
    the frequency divider, coupled between the voltage controlled oscillator and the phase frequency detector and configured to generate the feedback signal according to the clock signal and the frequency scale factor.

8. A clock and data recovery circuit, for recovering clock and data information from an input data signal, comprising:

a voltage controlled oscillator, configured to generate a clock signal according to a voltage signal;

a frequency detector, configured to detect whether increasing a frequency of the clock signal is required according to a plurality of sampling results of the input data signal and accordingly generate a first up control signal;

a phase detector, configured to receive the input data signal and the clock signal, detect phase lead or phase lag of the clock signal according to the sampling results of the input data signal and accordingly generate a second up control signal and a first down control signal;

a charge pump circuit, coupled to the voltage controlled oscillator and the phase detector and configured to adjust the voltage signal according to the second up control signal and the first down control signal; and a control circuit, coupled to the voltage controlled oscillator and the frequency detector and configured to adjust the voltage signal according to the first up control signal;

wherein in response to the frequency of the clock signal being equal to a multiplication result of a frequency of a reference signal and a frequency scale factor of a frequency divider, the frequency of the clock signal is locked, and is lower than a target clock frequency;

wherein the clock and data recovery circuit operates in a data recovery mode after detecting that the frequency of the clock signal is locked, the frequency detector and the phase detector operates in the data recovery mode, and the frequency detector is configured to detect whether unidirectionally increasing the frequency of the clock signal to be further locked to the target clock frequency is required in the data recovery mode.

9. The clock and data recovery circuit of claim 8, further comprising:

a phase frequency detector, configured to receive the reference signal and a feedback signal, detect phase difference between the reference signal and the feedback signal and accordingly generate a third up control signal and a second down control signal, wherein the phase frequency detector is configured to detect the phase difference in a clock recovery mode for the clock and data recovery circuit to lock the frequency of the clock signal, and the charge pump circuit is further coupled to the phase frequency detector and is configured to adjust the voltage signal according to the third up control signal and the second down control signal in the clock recovery mode.

10. The clock and data recovery circuit of claim 9, further comprising:

a multiplexer, coupled to the phase detector, the phase frequency detector and the charge pump circuit and configured to output the third up control signal and the second down control signal to the charge pump circuit in the clock recovery mode and output the second up control signal and the first down control signal to the charge pump circuit in the data recovery mode.

11. The clock and data recovery circuit of claim 9, further comprising:

the frequency divider, coupled between the voltage controlled oscillator and the phase frequency detector and configured to generate the feedback signal according to the clock signal and the frequency scale factor.

12. The clock and data recovery circuit of claim 9, wherein the frequency detector is enabled in beginning of the data recovery mode and is disabled after a predetermined period.

13. A clock and data recovery circuit, for recovering clock and data information from an input data signal, comprising:

a clock recovery module, configured to operate in a clock recovery mode to lock a frequency of a clock signal, wherein in response to the frequency of the clock signal being equal to a multiplication result of a frequency of a reference signal and a frequency scale factor of a frequency divider, the frequency of the clock signal is locked, and is lower than a target clock frequency; and a data recovery module, configured to operate in a data recovery mode to recover data information according to the input data signal, wherein the clock and data recovery circuit switches from the clock recovery mode to the data recovery mode after detecting that the frequency of the clock signal is locked, and the data recovery module comprises:

a voltage controlled oscillator, configured to generate the clock signal according to a voltage signal;

a charge pump circuit, coupled to the voltage controlled oscillator and configured to adjust the voltage signal according to a up control signal and a down control signal;

a frequency detector, configured to detect whether unidirectionally increasing the frequency of the clock signal to be further locked to the target clock frequency is required according to a plurality of sampling results of the input data signal and accordingly generate a supplementary up control signal; and a control circuit, coupled to the voltage controlled oscillator and the frequency detector and configured to further adjust the voltage signal according to the supplementary up control signal.

14. The clock and data recovery circuit of claim 13, wherein the frequency detector is enabled in beginning of the data recovery mode and is disabled after a predetermined period.

15. The clock and data recovery circuit of claim 13, wherein the control circuit comprises a current source and adjusts the voltage signal by controlling the current source to provide a current in response to the supplementary up control signal.

* * * * *